(12) United States Patent
Pang

(10) Patent No.: US 9,154,750 B2
(45) Date of Patent: Oct. 6, 2015

(54) CORRECTION OF IMAGE SENSOR FIXED-PATTERN NOISE (FPN) DUE TO COLOR FILTER PATTERN

(71) Applicant: OMNIVISION TECHNOLOGIES, INC., Santa Clara, CA (US)

(72) Inventor: Chin Poh Pang, Pleasanton, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 182 days.

(21) Appl. No.: 13/903,714

(22) Filed: May 28, 2013

(65) Prior Publication Data

US 2014/0354861 A1  Dec. 4, 2014

(51) Int. Cl.
*H04N 9/04* (2006.01)
*H04N 5/365* (2011.01)

(52) U.S. Cl.
CPC .............. *H04N 9/045* (2013.01); *H04N 5/365* (2013.01)

(58) Field of Classification Search
CPC ... H04N 5/365; H04N 9/7917; H04N 5/2351; H04N 9/045; H01L 27/14621
See application file for complete search history.

(56) References Cited

U.S. PATENT DOCUMENTS

| 7,687,757 | B1 * | 3/2010 | Tseng et al. | 250/208.1 |
| 7,830,428 | B2 | 11/2010 | Jerdev et al. | |
| 8,218,867 | B2 * | 7/2012 | Chien et al. | 382/167 |
| 8,890,981 | B2 * | 11/2014 | Kasai | 348/241 |
| 2009/0200451 | A1 * | 8/2009 | Conners | 250/208.1 |
| 2010/0246949 | A1 * | 9/2010 | Chien et al. | 382/167 |

OTHER PUBLICATIONS

TW 102145198—First Office Action with Search Report and English Translation, issued Jul. 13, 2015, 10 pages.

* cited by examiner

*Primary Examiner* — Ahmed A Berhan
(74) *Attorney, Agent, or Firm* — Blakely Sokoloff Taylor & Zafman LLP

(57) ABSTRACT

Embodiments of an apparatus including a pixel array and a color filter array optically coupled to the pixel array, the color filter array including a plurality of tiled minimal repeating units. Processing circuitry is coupled to the pixel array to correct fixed pattern noise (FPN) in an image captured by the pixel array. The processing circuitry corrects the values of pixels that are part of a correction group, and wherein the corrections comprise a combination of a color ratio correction that is based on the ratios of selected colors within the minimal repeating unit, and one or more crosstalk corrections that are based on a chief ray angle (CRA) correction and the color ratio correction.

24 Claims, 6 Drawing Sheets

CORRECTION OF IMAGE SENSOR FIXED-PATTERN NOISE (FPN) DUE TO COLOR FILTER PATTERN

TECHNICAL FIELD

The described embodiments relate generally to image sensors, and in particular, but not exclusively, to image sensors including correction of fixed-pattern noise (FPN) due to color filter pattern.

BACKGROUND

Image sensors are widely used in digital still cameras, cellular phones, security cameras, medical, automobile, and other applications. Complementary metal-oxide-semiconductor ("CMOS") technology is used to manufacture low-cost image sensors on silicon substrates.

Most image sensors include a two-dimensional array of pixels that are used to capture images. Color image sensors—that is, image sensors capable of capturing color images—assign color to each pixel in the pixel array using a color filter array ("CFA") coupled to the pixel array. The particular pattern of colors in the color filter array—that is, the colors used and the way they are arranged within the filter array—can improve the quality of the color image captured by the pixel array, but different color filter patterns can have different effects on the fixed pattern noise (FPN) in the image captured by the pixel array.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments are described of an apparatus, system and method for correction of image sensor fixed-pattern noise (FPN) due to color filter pattern. Specific details are described to provide a thorough understanding of the embodiments, but one skilled in the relevant art will recognize that the invention can still be practiced without one or more of the described details, or with other methods, components, materials, etc. In some instances, well-known structures, materials, or operations are not shown or described in detail but are nonetheless within the scope of the invention.

Reference throughout this specification to "one embodiment" or "an embodiment" means that a particular feature, structure, or characteristic is included in at least one described embodiment. Thus, appearances of the phrases "in one embodiment" or "in an embodiment" in this specification do not necessarily all refer to the same embodiment. Furthermore, the particular features, structures, or characteristics described can be combined in any suitable manner in one or more embodiments.

Figure 1:
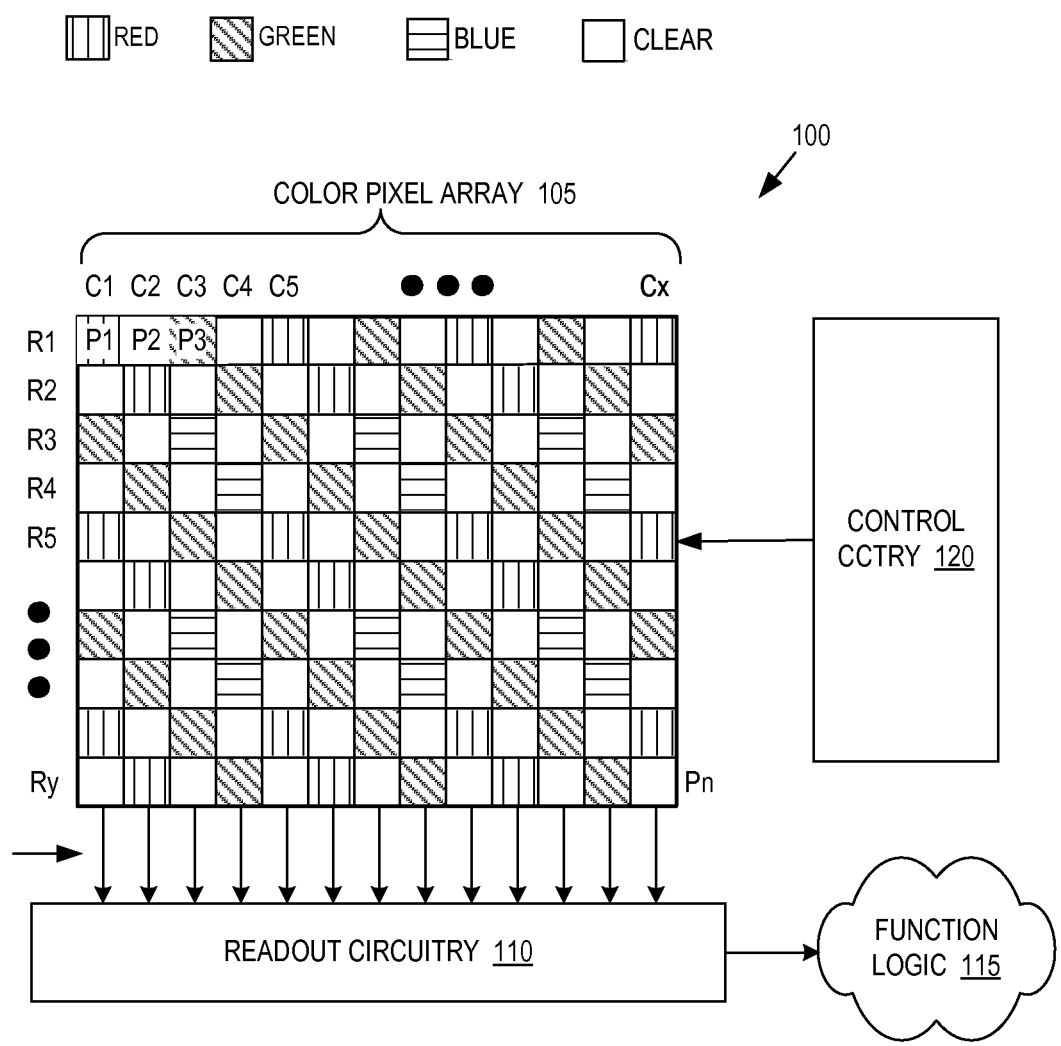
FIG. 1 is a schematic drawing of an embodiment of an image sensor including a color filter array.

FIG. 1 illustrates an embodiment of a CMOS image sensor 100 including a color pixel array 105, readout circuitry 110 coupled to the pixel array, function logic 115 coupled to the readout circuitry, and control circuitry 120 coupled to the pixel array. Color pixel array 105 is a two-dimensional ("2D") array of individual imaging sensors or pixels (e.g., pixels P1, P2 . . . , Pn) having X pixel columns and Y pixel rows and can be implemented as either a frontside-illuminated pixel array (see, e.g., FIG. 2A) or a backside-illuminated image pixel array (see, e.g., FIG. 2B). In one embodiment, each pixel in the array is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

Color pixel array 105 assigns color to each pixel using a color filter array ("CFA") coupled to the pixel array. CFAs assign a separate primary color to each pixel by placing a filter of that primary color over the pixel. Thus, for example, it is common to refer to a pixel as a "clear pixel" if it has no filter or is coupled to a clear (i.e., colorless) filter, as a "blue pixel" if it is coupled to a blue filter, as a "green pixel" if it is coupled to a green filter, or as a "red pixel" if it is coupled to a red filter. As photons pass through a filter of a certain primary color to reach the pixel, only wavelengths of that primary color pass through. All other wavelengths are absorbed.

After each pixel in pixel array 105 has acquired its image data or image charge, the image data is read out by readout circuitry 110 and transferred to function logic 115 for storage, additional processing, etc. Readout circuitry 110 can include amplification circuitry, analog-to-digital ("ADC") conversion circuitry, or other circuits. Function logic 115 can simply store the image data and/or manipulate the image data by applying post-image effects (e.g., crop, rotate, remove red eye, adjust brightness, adjust contrast, or otherwise). Function logic 115 can also be used in one embodiment to process the image data to correct (i.e., reduce or remove) fixed pattern noise.

Control circuitry 120 is coupled to pixel array 105 to control operational characteristic of color pixel array 105. For example, control circuitry 120 can generate a shutter signal for controlling image acquisition.

Figure 2A:
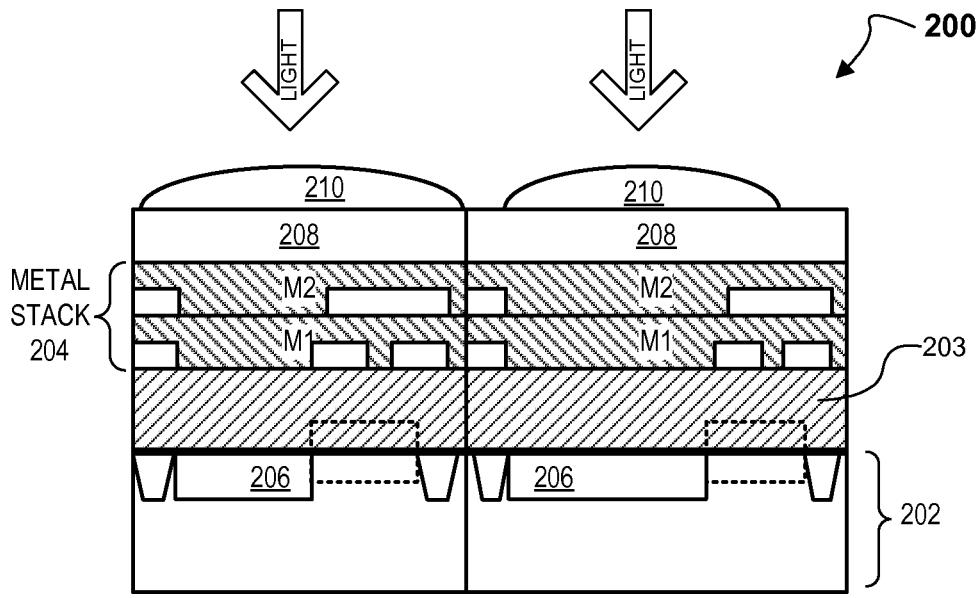
FIG. 2A is a cross-sectional view of an embodiment of a pair of pixels in the pixel array of a front side illuminated (FSI) image sensor.
Figure 2B:
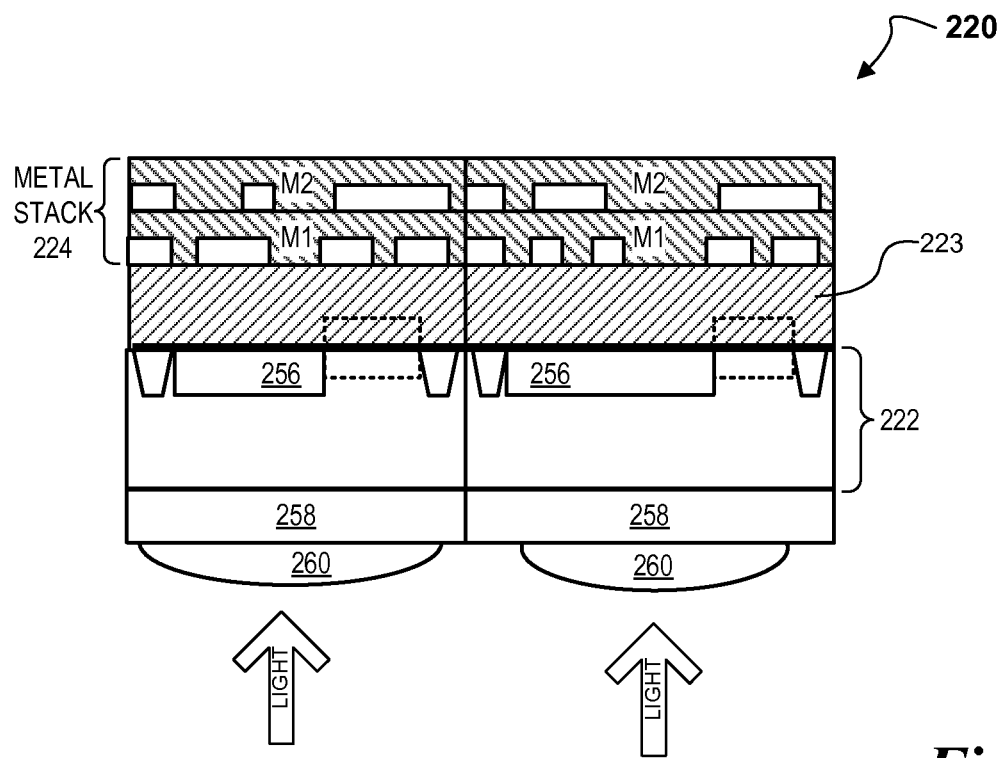
FIG. 2B is a cross-sectional view of an embodiment of a pair of pixels in the pixel array of a back side illuminated (BSI) image sensor.

FIGS. 2A-2B each illustrate cross-sections of a pair of pixels in a CMOS image sensor. FIG. 2A illustrates an embodiment of pixels 200 in a frontside-illuminated (FSI) CMOS image sensor. The front side of pixels 200 is the side of substrate 202 upon which the pixel circuitry is disposed and over which metal stack 204 for redistributing signals is formed. Metal layers M1 and M2 are separated from the front side by a dielectric layer 203 and are patterned in such a manner as to create an optical passage through which light incident on the frontside-illuminated pixels 200 can reach the photosensitive or photodiode ("PD") region 206. To implement a color image sensor, the front side includes color filters 208, each disposed under a microlens 210 that aids in focusing the light onto PD region 206.

FIG. 2B illustrates an embodiment of pixels 220 in a backside-illuminated (BSI) CMOS image sensor. As with pixels 200, the front side of pixels 220 is the side of substrate 222 upon which the pixel circuitry is disposed and over which dielectric 223 and metal stack 224 are formed for redistributing signals. The backside is the side of substrate 222 opposite the front side. To implement a BSI color image sensor, the backside includes color filters 258 disposed between the backside and microlenses 260. Microlenses 260 aid in focusing the light onto PD region 256. By illuminating the backside of pixels 220 instead of the front side, the metal interconnect lines in metal stack 224 do not obscure the path between the object being imaged and the collecting areas, resulting in greater signal generation by PD regions 256.

Figure 3:
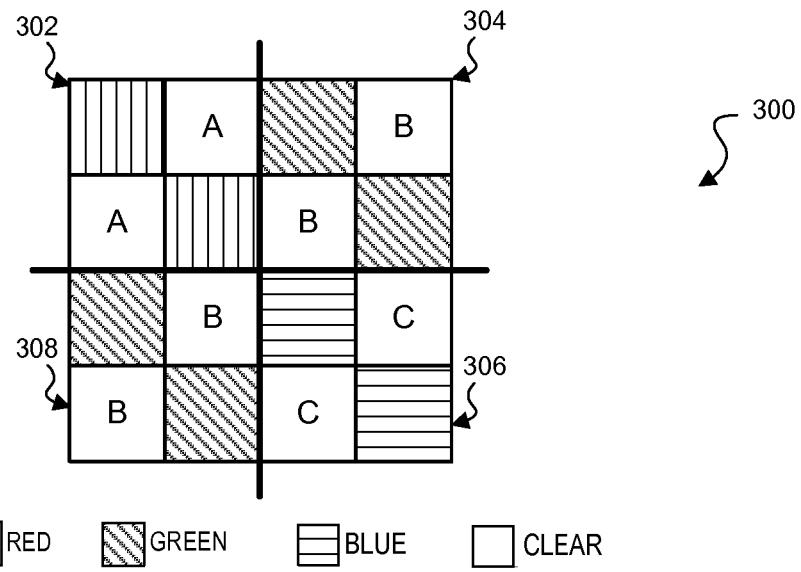
FIG. 3 is a plan view illustrating an embodiment of a minimal repeating unit of a color filter array.

FIG. 3 illustrates an embodiment of a minimal repeating unit (MRU) 300 of a color filter array. A minimal repeating unit is a repeating unit such that no other repeating unit has fewer individual filters. A given color filter array can include several repeating units, but a repeating unit is not a minimal repeating unit if there is another repeating unit in the array that includes fewer individual filters.

Minimal repeating unit 300 is four filters by four filters, for a total of 16 individual filters, and is made up of four abutting cells 302, 304, 306 and 308, each two filters by two filters. Each cell includes four individual filters: two clear (i.e., colorless) filters along one diagonal and two filters of the same color along the other diagonal. In the illustrated embodiment, diagonally opposed cells 304 and 308 have green filters, cell 306 has blue filters, and cell 308 has red filters. Thus, cell 302 is effectively a red cell, cell 306 is effectively a blue cell, and cells 304 and 308 are effectively green cells. In other embodiments a different set of primary colors could be used for the color filters in MRU 300. For example, in one embodiment the primary colors used could be cyan, magenta, and yellow. Since each individual filter is coupled to an individual pixel, it is common to refer to pixels and filters interchangeably such that, for example, a "red pixel" is a pixel coupled to a red filter.

Figure 4:
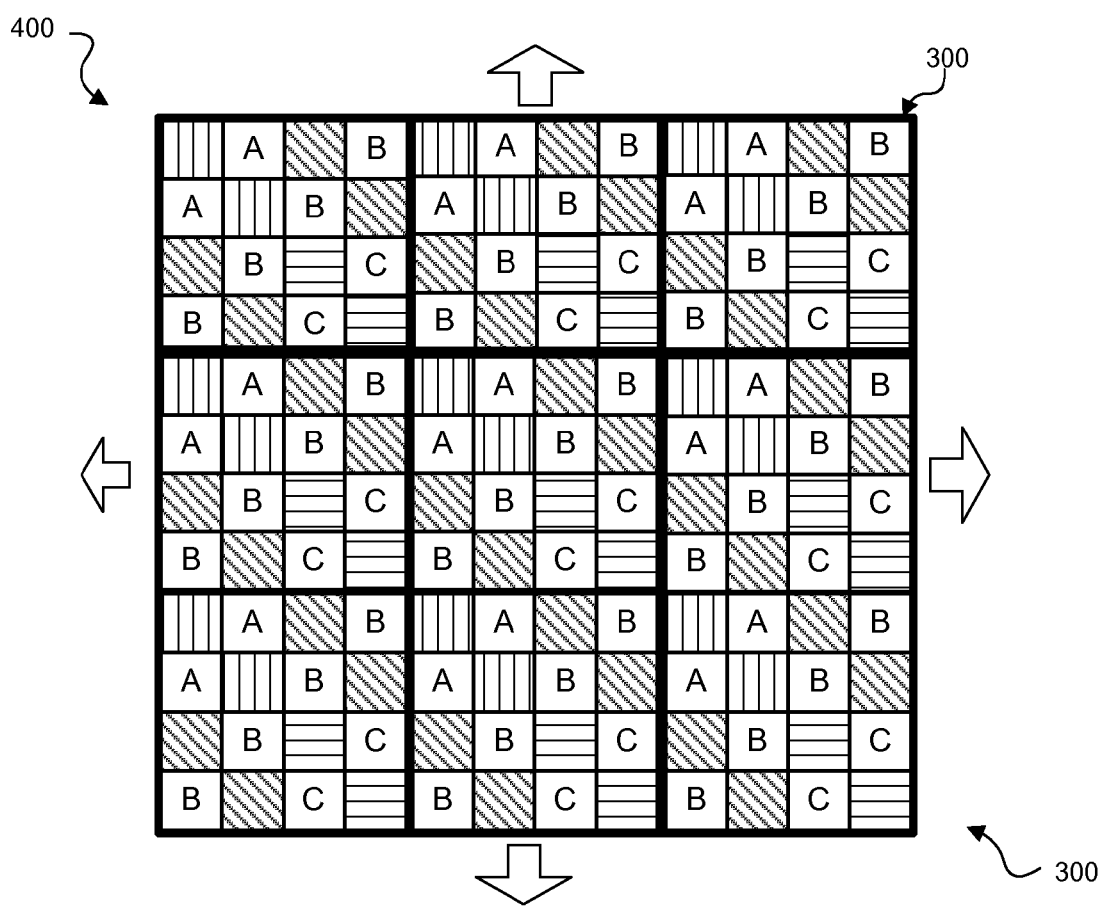
FIG. 4 is a plan view of an embodiment of a color filter array including a plurality of tiled minimal repeating units such as the one shown in FIG. 3.

FIG. 4 illustrates an embodiment of a color filter array (CFA) 400. Filter array 400 includes multiple MRUs 300 tiled together to form the color filter array. MRUs 300 are indicated in the drawing by a heavy outline. Each MRU is tiled into the filter array so that it abuts at least one other MRU along one of its edges. Only nine MRUs 300 are shown in the figure, but practical color filter array embodiments would use many more MRU's than shown, as indicated in the figure by the outwardly-pointing arrows. Color filter arrays are used together with pixel arrays in an image sensor; in most cases, a color filter array will include as many individual filters as there are pixels in the pixel array with which it will be coupled, meaning each pixel in the array will be optically coupled to a corresponding individual filter.

Figure 5:
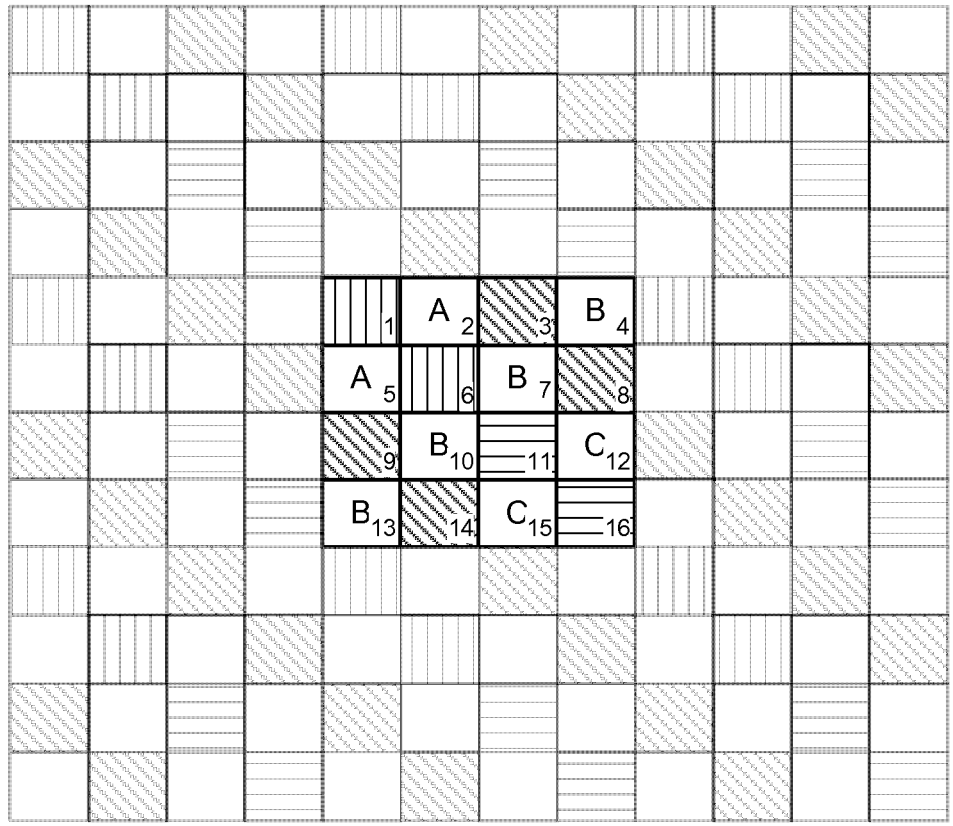
FIG. 5 is a plan view of an embodiment of a color filter array illustrating an embodiment of fixed pattern noise correction in a minimal repeating unit within the color filter array.

FIG. 5 illustrates an embodiment of a color filter array that uses MRU 300 and is labeled to explain an embodiment of a process to correct (i.e., reduce or eliminate) fixed pattern noise in the image data collected using a pixel array that uses the illustrated color filter array pattern.

In a color filter array using MRU 300, the clear filters can be classified into three categories, as shown in the figure: type A clear filters, each of which is surrounded by two green filters and two red filters; type B clear filters, each of which is surrounded by two green filters, one red filter, and one blue filter; and type C clear filters, each of which is surrounded by two green filters and two blue filters. In the illustrated color filter array, the different clear filters make different contributions to the fixed pattern noise. In some embodiments, type A and type C clear filters contribute the majority of fixed pattern noise, and in these embodiments the primary focus is on correcting signals from pixels coupled to the type A and type C filters to reduce or eliminate fixed pattern noise, as further discussed below. In other embodiments, however, the fixed pattern noise contribution of the different categories of clear pixel can be different, and in those embodiments the applicable category or categories can be corrected accordingly.

Two main corrections are applied to the pixel signals to reduce or eliminate fixed pattern noise: a color ratio correction and a crosstalk correction. In the illustrated filter pattern the color ratio issue comes about because of the separation of the clear pixels, and the fact that different clear pixels are surrounded by different colors in the color filter pattern. In one embodiment, the color ratio correction can be characterized using the formula:

$$\frac{R}{C} = A\left(\frac{\overline{C}}{\overline{R}}\right) + B\left(\frac{\overline{R}}{\overline{C}}\right) \qquad \text{(Eq. 1)}$$

in which A and B are weighting parameters; in one embodiment, weighting parameter A has a value of 0.5 and weighting parameter has a value of −1.5, but in other embodiments waiting parameters A and B can have other values. In Eq. 1, $\overline{R}$ is the average value of the diagonally adjacent red pixels in the MRU and $\overline{C}$ is the average value of adjoining clear pixels, computed according to the formulae:

$\overline{R} = \frac{1}{2}(P_1 + P_6)$, and $\overline{C} = \frac{1}{2}(P_2 + P_5)$, where $P_1$ and $P_6$ are the values of the red pixels in the MRU (i.e., pixels 1 and 6 in FIG. 5), and $P_2$ and $P_5$ are the values of the clear pixels associated with the red pixels in the MRU (i.e., type A clear pixels 2 and 5 in FIG. 5). In other words, in this embodiment the color ratio (R/C) is computed based on the individual filters in cell 302 of MRU 300.

The second correction is the crosstalk correction, which has horizontal and vertical components. Each of the horizontal and vertical components in turn has two parts: a chief ray angle (CRA) part and a color ratio part. The CRA part comes about because the chief ray angle—that is, the angle of incidence of the chief ray on the pixel array—is different in different parts of the pixel array. Generally the chief ray angle is lowest near the center of the array and higher near the edges of the array, meaning that crosstalk is similarly lowest near the center of the array and higher at the edges of the array. In some embodiments the CRA correction is largely a function of the optics used with the pixel array. In one embodiment the chief ray angle correction CRA can be computed for each pixel in the array using a fourth-power equation:

$$CRA = C_4 r^4 + C_3 r^3 + C_2 r^2 + C_1 r \qquad \text{(Eq. 2)}$$

in which r is the distance of the particular pixel from the center of the pixel array and C1-C4 are numerical coefficients. In one embodiment coefficients C1-C4 can be determined empirically by fitting a curve to data obtained using the particular optics that will be used with the pixel array, but in other embodiments different equations can be used to characterize the CRA correction.

To obtain a crosstalk correction for each pixel, the CRA correction and the color ratio correction are combined into horizontal and vertical crosstalk components using the following equations:

$$XT_h = \left(\frac{h}{r}\right)\left(\frac{R}{C}\right)(CRA)XT_{max} \quad \text{(Eq. 3)}$$

$$XT_v = \left(\frac{v}{r}\right)\left(\frac{R}{C}\right)(CRA)XT_{max} \quad \text{(Eq. 4)}$$

where $XT_h$ and $XT_v$ are horizontal and vertical crosstalk corrections, respectively; h and v are the horizontal and vertical distances of the pixel from the center of the array and r is the straight-line distance of the pixel from the center of the pixel array; $XT_{max}$ is a maximum crosstalk value, expressed as a decimal (e.g., 0.12 in one embodiment); CRA is the chief ray angle correction computed for the particular pixel using Eq. 2; and (R/C) is the color ratio computed using Eq. 1.

Having computed the color ratio correction and the crosstalk correction, the data values of the individual clear pixels—for the color filter array of FIG. 5, this means group A pixels and group C pixels—are corrected using a linear combination of the color ratio correction and the crosstalk correction. In one embodiment, a linear combination of the two corrections can be implemented according to the equation:

$$P_c = P\left[1 + w_1(XT_h + XT_v) + w_2\left(\frac{R}{C}\right)XT_{max}\right], \quad \text{(Eq. 5)}$$

in which $P_C$ is a corrected pixel value, P is the original pixel value, $w_1$ and $w_2$ are weighting factors that can depend on the particular clear pixel the to which the correction is applied, and the remaining terms are defined above in connection with Eqs. 1-4. Weighting factors $w_1$ and $w_2$ can have any integral or decimal value, including zero.

Figure 6:
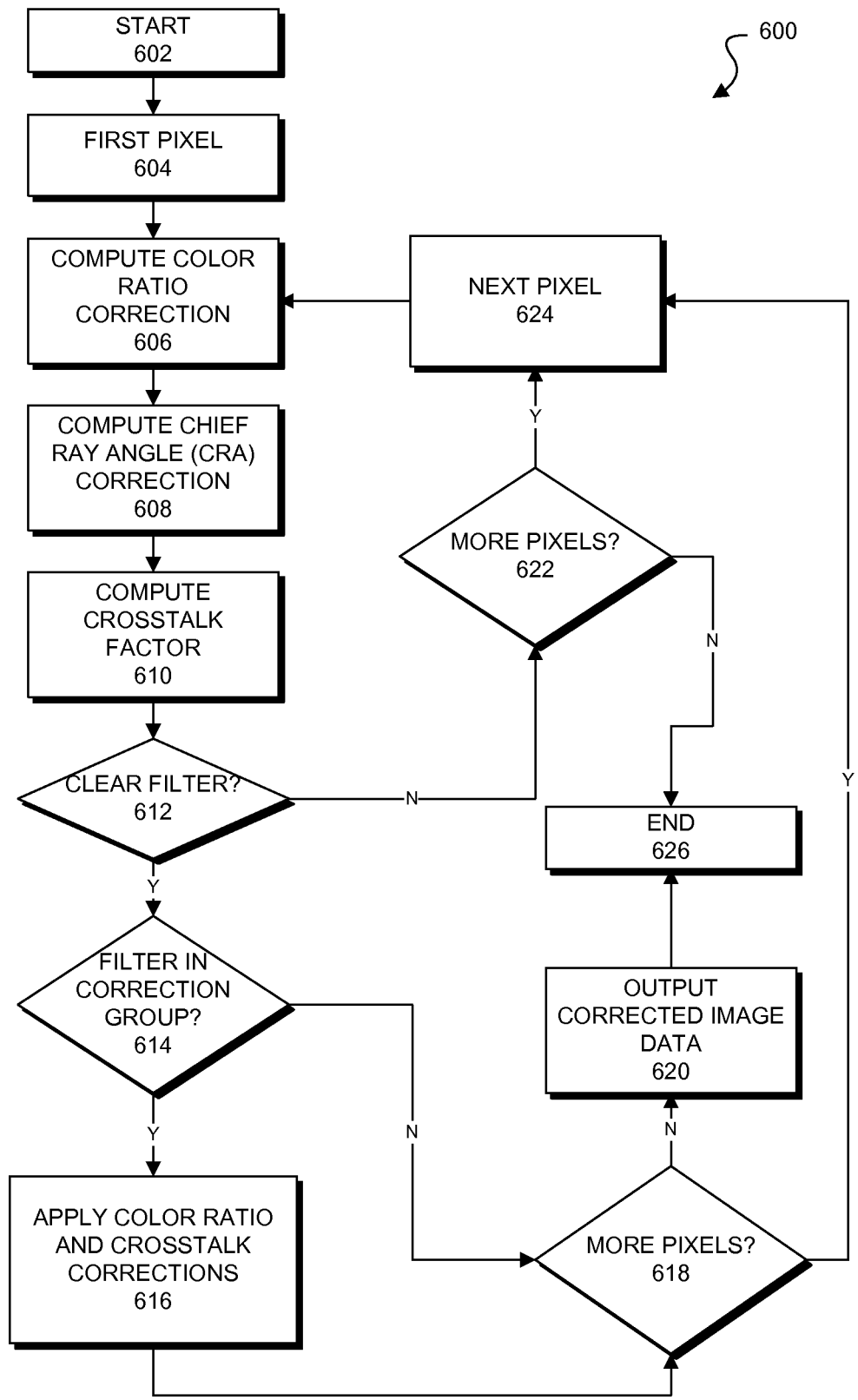
FIG. 6 is a flowchart of an embodiment of a process for correcting fixed pattern noise in an image sensor using a color filter array that includes clear filters.

FIG. 6 illustrates an embodiment of a process 600 for applying corrections in a pixel array including a CFA such as CFA 500. The process begins at block 602. At block 604, the process is set to a first individual pixel in the pixel array. At block 606, the process computes the color ratio correction for that pixel at block 606, and at block 608 computes the chief ray angle (CRA) correction for that pixel. At block 610, the process computes the crosstalk corrections for that pixel using the color ration correction and the CRA correction.

At block 612 the process checks whether the pixel is a clear filter. If the pixel is not clear the process moves to block 622, where it checks whether any pixels in the array remain to be processed. If more pixels remain to be processed at block 622, the process moves to block 624 which selects the next pixel in the array, and then goes back to through blocks 606-612 for the next pixel.

If at block 612 the process determines that the pixel is a clear pixel (i.e., it is coupled to a clear filter), the process moves to block 614 to determine whether the clear filter is in a correction category—in this embodiment, that means determining whether the clear filter is a group A or group C clear filter. If the clear filter is in the correction group, the process moves to block 616, where the crosstalk and color ratio corrections are applied to that pixel. If at block 614 the process determines that the clear filter at issue is not in a correction category, the process moves to block 618 to determine whether any more pixels in the pixel array remain to be processed. If there are no more pixels to be processed (i.e., all pixels in the array have been processed), the corrected image data is output at block 620 and the process ends at block 626.

After application of the corrections to the pixel at block 616, the process moves to block 618 to check whether any pixels in the array remain to be processed. If there are more pixels to be processed, then the process returns to block 624, where it selects another pixel, and then proceeds to block 606, where it repeats the process for the next pixel. If at block 618 no pixels remain to be processed (i.e., all pixels in the pixel array have been processed), the process moves on to block 620 where the corrected image data is output, and then moves to block 626 where the process ends.

Figure 7A:
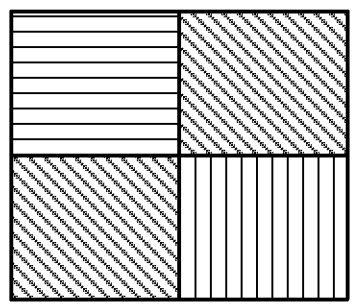
FIG. 7A is a plan view illustrating an embodiment of a minimal repeating unit of a color filter array that does not include clear filters.
Figure 7A:
Figure 7B:
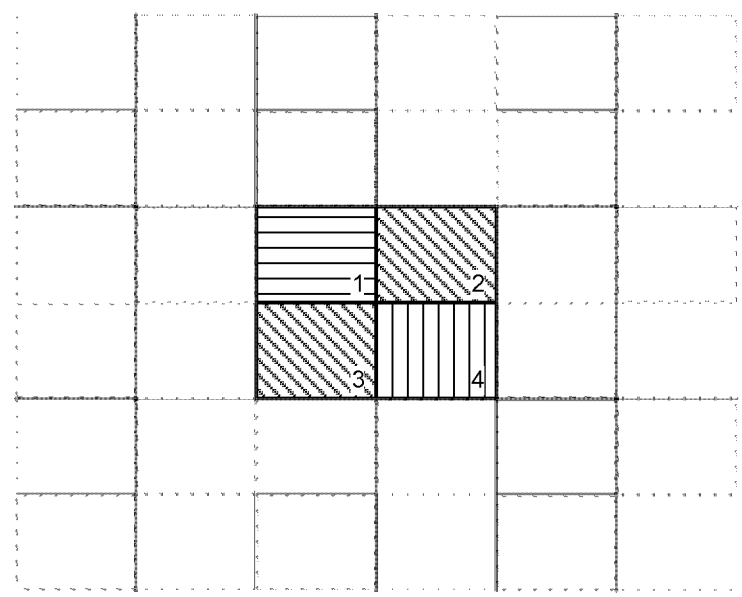
FIG. 7B is a plan view of an embodiment of a color filter array including a plurality of tiled minimal repeating units such as the one shown in FIG. 7A.

FIGS. 7A-7B illustrate an embodiment of a minimum repeating unit 700 and a corresponding color filter array that uses MRU 700. The primary difference between MRU 300 and MRU 700 is that MRU 700 includes no clear filters. MRU 700 is the MRU of a color filter array pattern commonly known as a red-green-blue (RGB) Bayer pattern because it used red, green and blue as its set of primary colors. Other embodiments of MRU 700 can, of course, use a different primary color set such as cyan, magenta and yellow, and can used a different arrangement of primary colors than shown. One embodiment of MRU 700 that includes cyan, magenta and yellow as its primary color set is known a CYYM pattern, because it include a cyan filter, two yellow filters, and a magenta filter.

Both the correction and process embodiments described for FIGS. 5 and 6 for a filter array with clear filters can be applied to arrays without clear filters, such as the illustrated Bayer pattern, by extension. For the corrections, the primary difference in the application to an array without clear filters is in the computation of the color ratio correction. In color filter arrays that do not include clear pixels, one of the colored pixels is used as a proxy for luminance, which is the information usually provided by the clear pixel. In an RGB pattern, green is usually used for luminance; in a CYYM pattern, yellow is usually used. Hence, in the illustrated RGB embodiment the color ratio correction can be computed using the equations:

$$\overline{R} = (P_1), \text{ and}$$

$$\overline{C} = \frac{1}{2}(P_2 + P_3),$$

where $P_1$ is the values of the red pixel in the MRU (i.e., pixel 1 in FIG. 7B), and $P_2$ and $P_3$ are the values of the green pixels (i.e., green pixels 2 and 5 in FIG. 5). Having computed the color ratio corrections, the CRA correction for each pixel can be computed according to Eq. 2, the crosstalk corrections $XT_h$ and $XT_v$ for each pixel can be computed according to Eqs. 3-4, and the overall correction for each pixel can still be computed according to Eq. 5.

The process illustrated in FIG. 6 still applies in an array without clear pixels. The primary difference is in which pixels the correction is applied to. In a filter array that does not include any clear pixels, the correction would be applied to the filters most analogous to clear filters—that is, the luminance filters. In the RGB pattern of FIG. 7B the correction according to Eq. 5 would be applied to the green pixels. In the process embodiment of FIG. 6, at block 612 the process would check whether the filter was green instead of clear, and at block 614 it would check whether the green pixel was part of a correction group. In one embodiment, all green pixels in the array can be part of the correction group, in which case block 614 can be omitted, but in other embodiments it may be desirable to define one or more correction groups of green pixels, such that some green pixels are corrected but other are not. In an embodiment using a CYYM filter pattern, the correction would be analogously applied to the yellow pixels.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
a pixel array;
a color filter array optically coupled to the pixel array, the color filter array including a plurality of tiled minimal repeating units;
processing circuitry coupled to the pixel array to correct fixed pattern noise (FPN) in an image captured by the pixel array, wherein the processing circuitry corrects values of pixels that are part of a correction group, and wherein the corrections comprise a combination of:
a color ratio correction that is based on the ratios of selected colors within each minimal repeating unit of the plurality of minimal repeating units, and
one or more crosstalk corrections that are based on a chief ray angle (CRA) correction and the color ratio correction.

2. The apparatus of claim 1 wherein each of the plurality of minimal repeating units is:

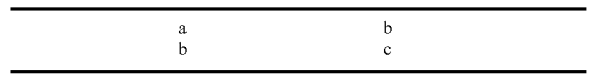

wherein a represents a filter of a first color, b represents filters of a second color, and c represents a filter of a third color.

3. The apparatus of claim 2 wherein a, b, and c are each respectively blue, red, and green.

4. The apparatus of claim 1 wherein each of the plurality of minimal repeating units includes a plurality of non-overlapping cells, each having at least two clear filters and at least two filters of a single color selected from a set of three colors, wherein each pixel optically coupled to a clear filter is a clear pixel and each pixel optically coupled to a color filter is a color pixel.

5. The apparatus of claim 4 wherein each of the plurality of minimal repeating units is:

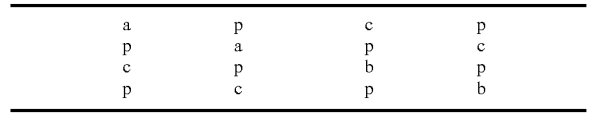

wherein p represents clear filters, a represents filters of a first color, b represents filters of a second color, and c represents filters of a third color.

6. The apparatus of claim 5 wherein a, b, and c are each respectively red, blue, and green.

7. The apparatus of claim 5 wherein a, b, and c are each respectively cyan, magenta, and yellow.

8. The apparatus of claim 4 wherein the clear pixels can be classified into a plurality of groups, such that all clear pixels in the same group are surrounded by the same combination of color pixels but clear pixels in different groups are surrounded by different combinations of color pixels.

9. The apparatus of claim 8 wherein the correction group can comprise all of the plurality of groups or less than all of the plurality of groups.

10. The apparatus of claim 4 wherein the color ratio correction is based on the ratio of the average of color pixels in one cell to the average of the clear pixels in the same cell.

11. The apparatus of claim 1 wherein the one or more crosstalk corrections include a vertical crosstalk correction and a horizontal crosstalk correction.

12. The apparatus of claim 11 wherein the correction is a linear combination of the color ratio correction and the one or more crosstalk corrections.

13. A process comprising:
receiving a signal from each pixel in a pixel array optically coupled to a color filter array, the color filter array including a plurality of tiled minimal repeating units;
correcting the signals of pixels that are part one or more correction groups in the pixel array to reduce or eliminate fixed pattern noise (FPN) in an image captured by the pixel array, wherein correcting the signal comprises, for each individual pixel in the array:
determining a color ratio correction for the individual pixel that is based on the ratios of selected colors within each minimal repeating unit of the plurality of minimal repeating units,
determining one or more crosstalk corrections for the individual pixel that are based on a chief ray angle (CRA) correction and the color ratio correction, and
if the individual pixel is part of a correction group, correcting the signal from the individual pixel using a combination of the color ratio correction and the one or more crosstalk corrections.

14. The process of claim 13 wherein each of the plurality of minimal repeating units is:

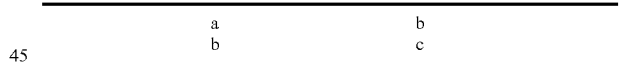

wherein a represents a filter of a first color, b represents filters of a second color, and c represents a filter of a third color.

15. The apparatus of claim 14 wherein a, b, and c are each respectively blue, red, and green.

16. The process of claim 13 wherein each of the plurality of minimal repeating units includes a plurality of non-overlapping cells, each having at least two clear filters and at least two filters of a single color selected from a set of three colors, wherein each pixel optically coupled to a clear filter is a clear pixel and each pixel optically coupled to a color filter is a color pixel.

17. The process of claim 16 wherein each of the plurality of minimal repeating units is:

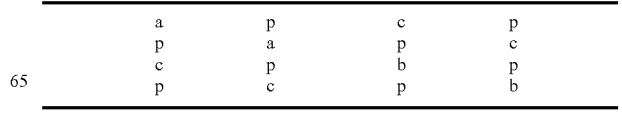

wherein p represents clear filters, a represents filters of a first color, b represents filters of a second color, and c represents filters of a third color.

18. The process of claim 17 wherein a, b, and c are each respectively red, blue, and green.

19. The process of claim 17 wherein a, b, and c are each respectively cyan, magenta, and yellow.

20. The process of claim 16, further comprising classifying the clear pixels into a plurality of groups, such that all clear pixels in the same group are surrounded by the same combination of color pixels but clear pixels in different groups are surrounded by different combinations of color pixels.

21. The process of claim 20 wherein the correction group can comprise all of the plurality of groups or less than all of the plurality of groups.

22. The process of claim 16 wherein the color ratio correction is based on the ratio of the average of color pixels in one cell to the average of the clear pixels in the same cell.

23. The process of claim 13 wherein the one or more crosstalk corrections include a vertical crosstalk correction and a horizontal crosstalk correction.

24. The process of claim 13 wherein the correction is a linear combination of the color ratio correction and the one or more crosstalk corrections.

* * * * *